United States Patent [19]

Yamamoto

[11] Patent Number: 4,832,620
[45] Date of Patent: May 23, 1989

[54] ELECTRICAL CONNECTOR TERMINAL FOR A FLEXIBLE PRINTED CIRCUIT BOARD

[75] Inventor: Nobumasa Yamamoto, Tokyo, Japan

[73] Assignee: E. I. Du Pont de Nemours and Company, Wilmington, Del.

[21] Appl. No.: 178,963

[22] Filed: Apr. 7, 1988

[30] Foreign Application Priority Data

Apr. 10, 1987 [JP] Japan .................................. 62-88191

[51] Int. Cl.[4] .............................................. H01R 4/24
[52] U.S. Cl. ..................................... 439/422; 439/877
[58] Field of Search ............................... 439/492–499, 439/387, 389, 391, 421–426, 430, 442, 877

[56] References Cited

U.S. PATENT DOCUMENTS 3,247,316  4/1966  Weimer ................................ 439/422
3,728,473  4/1973  Kuo ..................................... 439/424
3,934,075  1/1976  Dilliplane .......................... 174/75 R
3,997,233  12/1976  Evans ................................. 339/97 C
4,560,224  12/1985  Weisenburger ..................... 439/422

FOREIGN PATENT DOCUMENTS 1435457  5/1976  United Kingdom ................ 439/421

Primary Examiner—David Pirlot

[57] ABSTRACT

An electrical connector terminal for a flexible printed circuit board which has an elongated plate-like bottom section, a plurality of projections rising from both edges of the bottom section and a contact piece coupled at one end thereof to the bottom section so as to extend over the bottom section with the printed circuit board therebetween, the contact piece being fixed to the printed circuit board in a manner such that the projections are bent to press and hold the contact piece against the surface of the circuit board.

5 Claims, 2 Drawing Sheets

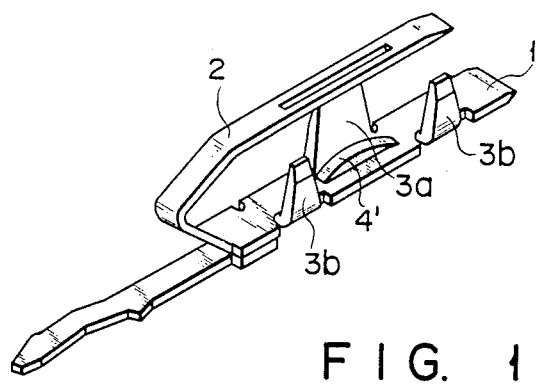
F I G. 1
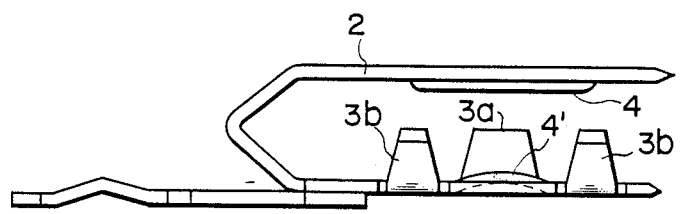
F I G. 2
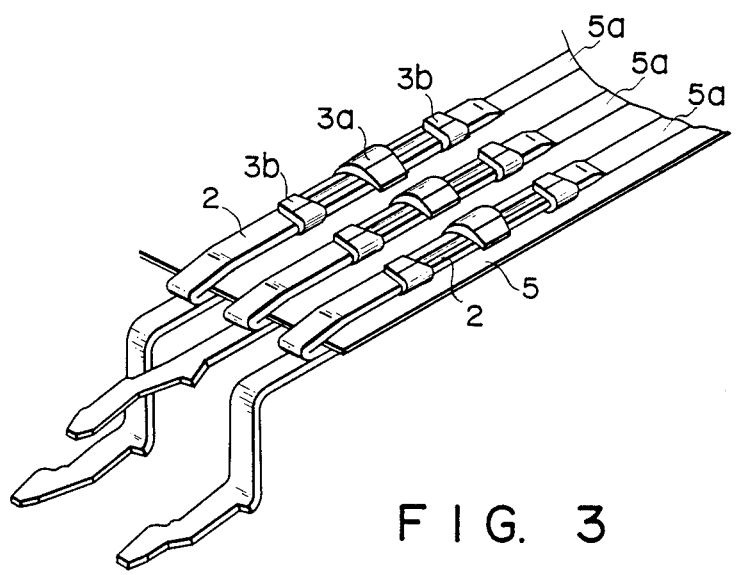
F I G. 3

ELECTRICAL CONNECTOR TERMINAL FOR A FLEXIBLE PRINTED CIRCUIT BOARD

BACKGROUND OF THE INVENTION

1. Field of the Invention

The present invention relates to an electrical connector terminal for a flexible printed circuit board and more particularly to a terminal which provides more reliable mechanical and electrical connection to the circuit board.

2. Description of the Prior Art

Several types of electrical connector terminals have been used for flexible printed circuit boards. FIGS. 4a and 4c illustrate one type wherein the terminal has an elongated plate-like strip 41 with integrally formed projections 42 extending upward at the sides. The strip portion of the terminal is located under a conductor 5a of a flexible printed circuit board 5 so that the projections 42 penetrate the circuit board at both sides of the conductor 5a. The ends of projections 42, which are sticking out of the top surface of the board, are then bent onto the conductor 5a of the flexible circuit board and fixed directly to the conductor by crimping for electrical connection, as shown in FIG. 4c. Another variation of this type of terminal for a flexible circuit board is shown in FIGS. 4b and 4d. In this variation, the terminal has a group of projections 42 extending from the flat upper surface of its plate-like strip 41. Thus, when located beneath a conductor 5a of the flexible circuit board, the projections 42 will penetrate the board and conductor 5a directly from below. The projections 42 are then bent and crimped directly to the conductor 5a by crimping as shown in FIG. 4d. In both the foregoing examples, the clamping force exerted by the ends of the projections 41 is small since the circuit board onto which the ends are directly fixed by crimping is flexible. The junction between the flexible circuit board and the projections are therefor more likely to be loosened by external factors such as heat, vibration, the bending of the circuit board and the like, thereby making the electrical connection unstable.

FIG. 5 shows another prior art terminal which is somewhat similar to the terminal disclosed in U.S. Pat. No. 3,997,233 issued Dec. 14, 1976 to Robert F. Evans and assiqned to same assignee as present application. The terminal in FIG. 5 comprises two contact pieces 51 and 52 which are adapted to hold a flexible printed circuit board between them. Piece 51 has opening 53, while piece 51 is formed with projection 54 which can be fitted into opening 53. The flexible printed circuit board is clamped between contact pieces 51 and 52 of the terminal so that projection 54 of piece 52 penetrates the conductor portion of the flexible circuit board and sticks out behind piece 51 through opening 53. The projecting end of projection 54 is bent and fastened to the reverse side of contact piece 51 by crimping. In this arrangement, contact piece 51, on which projection 54 is directly fitted by crimping, is a strong metal piece, so that the terminal can clamp the flexible printed circuit board firmly. However, since the flexible circuit board is formed with a cut across its conductor which is adapted to be penetrated by projection 54, the conductor is fragile and may possibly be broken, depending on its pitch of arrangement.

SUMMARY OF THE INVENTION

The object of the present invention is to provide an electrical connector terminal for a flexible printed circuit board which can be fastened securely to a metal piece by crimping without piercing or breaking the conductor of the circuit board instead of being crimped directly to the flexible circuit board itself.

According to the present invention, there is provided an electrical connector terminal for a flexible printed circuit board which comprises an elongated plate-like bottom section or base, a plurality of projections or tabs rising from both edges of the bottom section and a contact piece coupled at one end thereof to the bottom section so as to extend over the bottom section with the printed circuit board therebetween, the contact piece being to be fixed to the printed circuit board in a manner such that the projections are bent to press and hold the contact piece against the conductor on the surface of the circuit board.

In the electrical connector terminal for a printed circuit board constructed in this manner, the projections are crimped to the contact piece which overlies the conductor of the flexible circuit board instead of being crimped directly to the flexible printed circuit board. Thus the terminal can clamp the flexible circuit board securely. Arranged along both side edges of the bottom section, moreover, the projections do not penetrate the conductor of the circuit board and therefore cannot break the conductor. Situated in this manner, furthermore, the projections cannot be dislocated by the crimping work and can be fixed securely to accurate positions.

BRIEF DESCRIPTION OF THE DRAWINGS

FIG. 1 is a perspective view of a connector terminal according to an embodiment of the present invention;

FIG. 2 is a side view of the connector terminal shown in FIG. 1;

FIG. 3 is a perspective view showing several of the connector terminals of FIG. 1 mounted on a flexible printed circuit board; an FIGS. 4a–4d and 5 are perspective views showing different types of prior art connector terminals.

DETAILED DESCRIPTION OF A PREFERRED EMBODIMENT

Figure 4A:
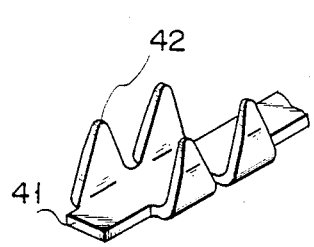
Figure 4B:
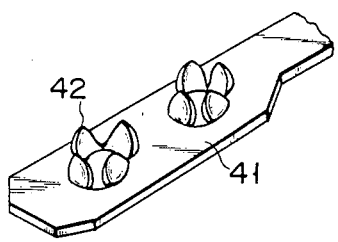
Figure 4C:
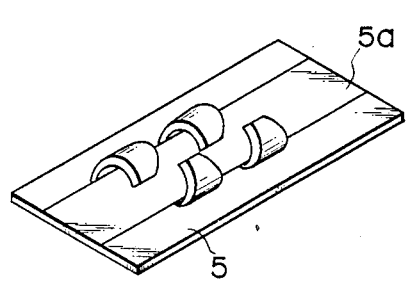
Figure 4D:
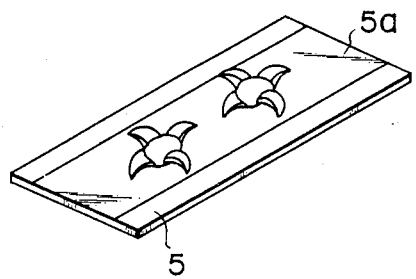
Figure 5:
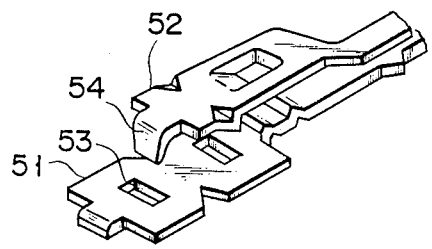

A preferred embodiment of the present invention is shown in FIGS. 1 to 3. The electrical connector terminal includes an elongated plate-like bottom section or base 1 and an elongated top section or contact piece 2. The base and contact piece are formed integrally so that the contact piece 2 extends from one end of the base 1 through a reverse angle bend and back over and above the top surface of the base 1. The contact piece 2 can easily be pressed downward toward the base. The terminal shown has another extension from the base for mating the terminal with, for example, another connector.

Projections or crimp tabs 3a and 3b are formed integrally at the two opposite side edges of the base 1 and extend upward toward the contact piece 2. In the embodiment of FIGS. 1–3, three crimp tabs are shown. A relatively wide crimp tab 3a is formed along one side edge of the base 1 while two somewhat narrower crimp tabs 3b are formed along the other side edge. The tabs are arranged so that crimp tab 3a on the one side edge of base 1 is opposite the gap or space between the two crimp tabs 3b on the other side edge of base 1. In order to prevent dislocation of the contact piece 2 during crimping, in particular, it is preferable to provide at last three crimp tabs.

FIG. 3 shows several of the above-described terminals mounted on a flexible circuit board 5. The circuit board has a number of conductors 5a and each terminal is mounted so that its contact piece 2 is in electrical contact with one of the conductors 5a. This is accomplished by inserting the flexible circuit board 5 between the base 1 and contact piece 2 of the terminal and aligning the conductor 5a so that it extends lengthwise between the base 1 and contact piece 2 and faces the latter. The crimp tabs 3a and 3b penetrate the flexible circuit board from the bottom through the top surface on opposite sides of the conductor 5a but do not pierce the conductor. The contact piece is then pressed against the conductor 5a on the upper surface of the flexible printed circuit board 5 so that good electrical contact is achieved between the two. Thereafter, crimp tabs 3a and 3b are bent down over the top of the contact piece 2 and then fastened thereto by crimping. Each connector terminal can thereby be fixed to this flexible printed circuit board so that its contact piece 2 is in electrical contact with a conductor 5a of the flexible printed circuit board. Since crimp tabs 3a and 3b are secured to the metallic contact piece by crimping, the terminal and flexible printed circuit board are reliably interconnected both mechanically and electrically without penetration or tearing of the fragile conductors on the circuit board.

For an even more reliable connection, the lower surface of contact piece 2 can be provided with a protrusion 4. Likewise, the upper surface of the base 1 may be provided with a protrusion 4' aligned with the protrusion 4 in the contact piece 2. When the contact piece 2 is crimped to the conductor 5a on the flexible circuit board, the protrusions ensure good electrical contact between the terminal and the circuit board.

I claim:

1. An electrical connector terminal for a flexible printed circuit board having an array of exposed conductors disposed on at least one surface thereof, said terminal comprising:

an elongated, plate-like bottom base section having opposed longitudinal side edges;

an elongated contact piece extending lengthwise above said base section and joined thereto at one end, said contact piece adapted to be pressed downward toward said base section so as to align linearly with and electrically contact one conductor of said array on said one surface of the circuit board; and a plurality of projections extending upward from said side edges toward the contact piece, said projections adapted to penetrate the flexible printed circuit board in areas adjacent each side of the conductor but not piercing said conductor, said projections further adapted to be bent over and crimped to the downwardly pressed contact piece, whereby said connector terminal is mounted on a flexible printed circuit board by inserting the circuit board between said base section and said contact piece so that a conductor of said array on the one surface of said circuit board is aligned linearly with and faces the contact piece, said projections piercing through the other surface of the circuit board and extending up from said one surface thereof with the conductor linearly aligned therebetween, said contact piece being pressed downward into electrical contact with the exposed conductor along its length and said projections being bent over and crimped to the contact piece.

2. An electrical connector terminal according to claim 1 wherein said contact piece has a protrusion on the lower surface thereof which contacts said conductor.

3. An electrical connector terminal according to claim 2 wherein said base section has a protrusion on the upper surface thereof facing the protrusion of the contact piece.

4. An electrical connector terminal according to claim 1 wherein said plurality of projections comprise a pair of projections provided on one side edge of said base section and a third projection provided on the other side edge of the base section, said third projection being positioned so as to face the space between the pair of projections on the other side edge.

5. An electrical connector terminal according to claim 4, wherein the third projection is wider than either one of the pair of projections.

* * * * *